July 8, 1969 W. FULOP ET AL 3,454,843

MODULATING DEVICE HAVING A CURVED P-N JUNCTION

Filed May 25, 1966

Inventors
WALTER FULOP
PAUL C. M. de BELATINI
By [signature]
Attorney

United States Patent Office 3,454,843
Patented July 8, 1969

3,454,843
MODULATING DEVICE HAVING A CURVED P-N JUNCTION

Walter Fulop, Herts, England, and Paul Charles Maria de Belatini, Tuskegee Institute, Ala., assignors to International Standard Electric Corporation, New York, N.Y., a corporation of Delaware Filed May 25, 1966, Ser. No. 552,883
Claims priority, application Great Britain, Aug. 13, 1965, 34,727/65
Int. Cl. H01l *15/02*
U.S. Cl. 317—235 7 Claims

ABSTRACT OF THE DISCLOSURE

This is a semiconductor device wherein the angle of the reflection of a beam of light upon a curved p-n junction is varied in proportion to changes in a bias voltage applied across said junction.

This invention relates to semiconductor light modulators containing a p-n junction close to the surface in which incident light is reflected from a layer surrounding the p-n junction by local modulation in space and in magnitude in the vicinity of the junction.

According to the invention a semiconductor light modulator includes a body of semiconductor material having a curved p-n junction region close to at least one flat surface of the body and electrical contact means to the *p* and *n* regions respectively, the contact means leaving unobscured a part of the flat surface or surfaces through which incident and reflected light may pass to and from a reflecting layer surrounding the p-n junction.

In one mode of operation the abrupt changes in semiconductor material at the edge of a space-charge layer surrounding a p-n junction (e.g. carrier concentration, refractivity etc.) can be utilised as a reflecting layer. In semiconductors radiation longer in wavelength than the principal absorption edge can be strongly absorbed by free carriers. P-n junction in semiconductors are regions relatively free of mobile carriers and their boundaries with the adjacent bulk material, full of mobile carriers, fairly abrupt. Since the edge of the space charge layer can be varied in position from several tens of microns to a fraction of a micron by means of a variable electrical bias across the junction the boundary of the space charge layer forms in effect a "mirror" whose position can be very rapidly varied, in the kilomegacycle range if required, with little expenditure of electrical power save that current required to charge and discharge the variable width space-charge acting as a variable condenser.

To obtain angular deflection of a reflected beam of light, if a flat mirror is used it is necessary to impart an angular movement to the mirror. If, however, a curved mirror is used and the incident light strikes the mirror at an angle, simple linear movement of the mirror will suffice to impart an angular deflection to the reflected light.

Figure 1:
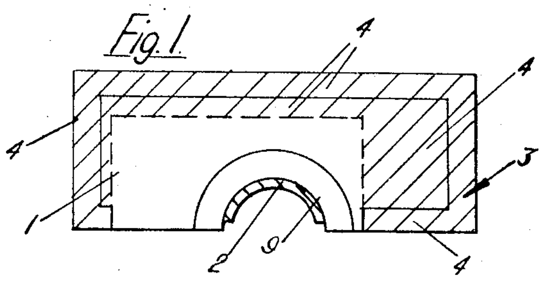
Figure 2:
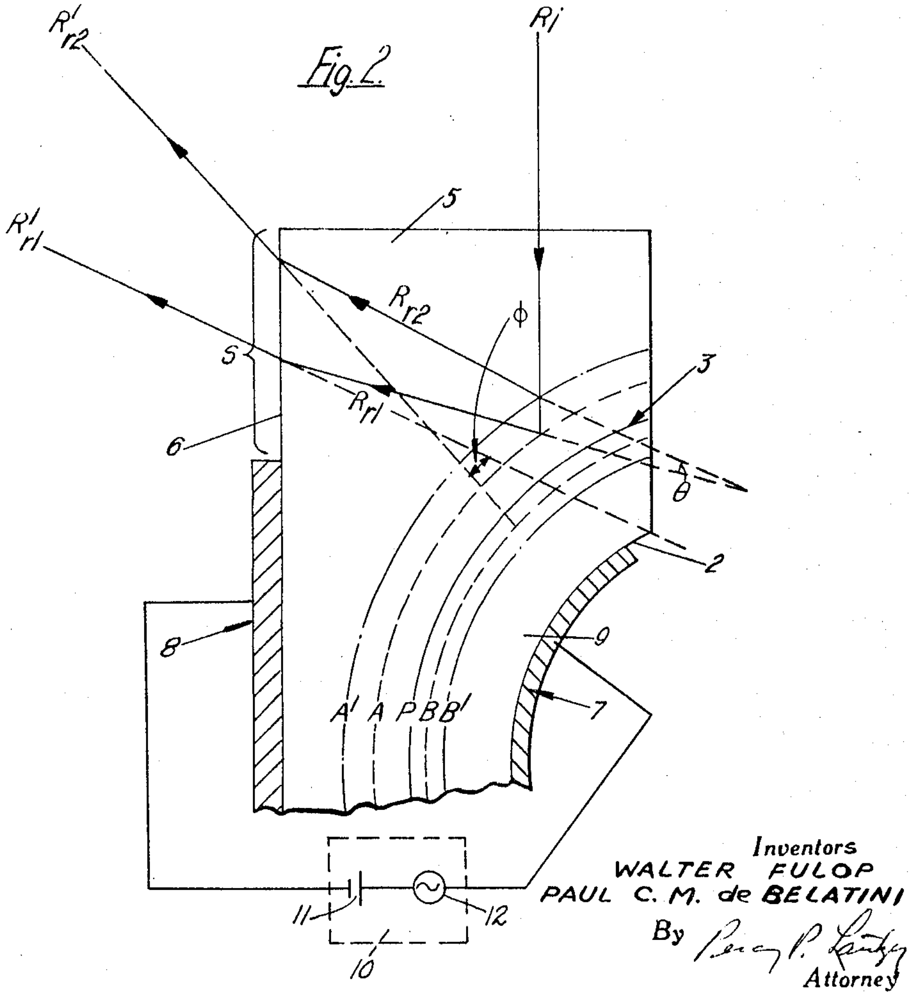

The above features of the invention will become more readily apparent in the following description of one embodiment thereof, taken in conjunction with the accompanying drawings in which FIG. 1 illustrates diagrammatically the construction of a curved p-n junction region, and FIG. 2 illustrates the effect of a movable curved junction region on an incident light beam.

A block 1 of semiconductor material has a semi-circular groove 2 formed in one face. A p-n junction region 3 is then diffused into the block and is followed by removal of the shaded portions 4. The resultant structure contains a curved p-n junction region adjacent two flat faces, part of which is shown in detail in FIG. 2.

A light beam R*i* is incident upon the n region 5 of a semiconductor, its wavelength being longer than that corresponding to the principal absorption edge. The n region 5 terminates on one side in the p-n junction 3 whose contour P has, suitable shaping (described above) of the semiconductor body and subsequent diffusion, the shape of part of a circular cylinder. The groove 2 and part of the face 6 are provided with electrical contact layers 7, 8 which are connected to an electrical bias source 10 having a battery 11 and modulating voltage signal 12. At a given bias the extent of the space charge on either side of the junction is (say) given by the dotted lines A and B whose contours are also of course that of part of a circular cylinder. At the edge of the space charge A *abrupt* changes in the properties of the semiconductor occur (refractivity, conductivity i.e. change in free carrier density etc.) as a result of which part of the energy of R*i* is reflected along $R_{r1}$ inside the n region 5 and emerging from the crystal after refraction along $R'_{r1}$.

Now on changing the bias across the p-n junction the edges of the space charge can be made to move to positions A′ and B′. As a result of this movement of the cylindrical surface representing the edge of the space charge the reflected ray $R'_{r2}$ is now in a direction different from $R_{r1}$, having been tilted through an angle $\theta$. Ray $R_{r2}$ after refraction appears outside as $R'_{r2}$, which has an angle $\phi$ with $R'_{r1}$. By suitable shaping or tilting of the contours, where the reflected rays emerge, a divergent lens-effect can be obtained, resulting in $\phi>\theta$ and thus increasing the scanning effect. Of course an external divergent lens could be used for the same effect. Thus by movement of the space charge edge about a quiescent position A to either side of it by a variable electrical bias across the p-n junction of light beam of constant incident direction is made to scan through a finite angle. Depending upon the doping level and profile around the p-n junction the space charge excursion can be anything from fractions to several microns. This doping level and profile are optimsed for adequate reflectivity and resonable space charge excursions at practical voltages. Avalanche breakdown of the junction limiting this excursion will have to be borne in mind.

In the embodiment described above a body of n-type gallium phosphide (GaP) has the groove 2 formed by preferential etching or any other suitable means. The p-n junction 3 is obtained by the diffusion of zinc to obtain the shallow p-type region 9 and the unwanted parts of the p-type region is subsequently removed by etching or grinding. The electrical contact layers 7, 8 can be plated on or formed by any suitable method, leaving adequate window space S for the light beams.

The p-n junction may be forward or reverse biased, depending on the materials and the degree of movement of the boundary required.

It is to be understood that the foregoing description of specific examples of this invention is made by way of example only is not to be considered as a limitation on its scope.

What we claim is:

1. A semiconductor light modulating device, comprising:

a body of semiconductor material having first and second regions of opposite conductivity type with a p-n junction therebetween, said junction having a curved portion disposed in close proximity to a given surface of said body such that a substantial portion of any light transmitted through said surface reaches said curved portion; and a pair of electrodes each contacting a given one of said regions, said electrodes leaving unobscured the part of said given surface proximate to said curved portion whereby at least a portion of any incident light entering said given surface part may be reflected from the vicinity of said junction.

2. A semiconductor light modulating device according to claim 1, wherein said given surface part is substantially flat.

3. A semiconductor light modulating device according to claim 1, further comprising electrical bias means coupled to said electrodes for varying the effective width of a space charge region associated with said junction thereby to vary the direction in which said incident light is reflected from the vicinity of said junction.

4. A semiconductor light modulating device according to claim 1, wherein a selected one of said electrodes is disposed on a curved recess in a selected surface of said body, at least a portion of the surface of said recess being substantially parallel to said curved portion and in close proximity to said given surface part.

5. A semiconductor light modulating device according to claim 4, wherein said recess is a groove parallel to said curved portion.

6. A semiconductor light modulating device according to claim 1, wherein said first region comprises n-type gallium phosphide.

7. A semiconductor light modulating device according to claim 6, wherein said second region is formed by diffusion of zinc into said first region.

References Cited

UNITED STATES PATENTS

| | | | |
|---|---|---|---|
| 2,846,346 | 8/1958 | Bradley | 317—235 |
| 3,112,230 | 11/1963 | Rudenberg | 317—235 |
| 3,293,513 | 12/1966 | Biard et al. | 317—235 |
| 3,302,051 | 1/1967 | Galginaitis | 317—235 |
| 3,330,991 | 7/1967 | Lavine et al. | 317—235 |
| 3,341,857 | 9/1967 | Kabell | 317—235 |
| 3,351,493 | 11/1967 | Weiman et al. | 317—235 |

OTHER REFERENCES

Injection Laser With Controlled Frequency Mode Switching, by Rutz et al., I.B.M. Technical Disclosure Bulletin, vol. 7, No. 4, September 1964, p. 336.

Light-Emitting Gallium, Arsenide Diode, by Michelitsch, I.B.M. Technical Bulletin, vol. 8, No. 1, June 1965, p. 191.

JAMES W. LAWRENCE, *Primary Examiner.*

A. J. JAMES, *Assistant Examiner.*

U.S. Cl. X.R.

313—108; 317—234; 350—160